(12) United States Patent
Chakrabarti et al.

(10) Patent No.: US 6,437,425 B1
(45) Date of Patent: Aug. 20, 2002

(54) SEMICONDUCTOR DEVICES WHICH UTILIZE LOW K DIELECTRICS

(75) Inventors: Utpal Kumar Chakrabarti, Allentown; Bora M Onat, Macungie; Kevin Cyrus Robinson, Upper Milford Township, Lehigh County; Biswanath Roy, Bethlehem, all of PA (US); Ping Wu, Warren, NJ (US)

(73) Assignee: Agere Systems Guardian Corp, Orlando, FL (US)

( * ) Notice: Subject to any disclaimer, the term of this patent is extended or adjusted under 35 U.S.C. 154(b) by 0 days.

(21) Appl. No.: 09/487,400

(22) Filed: Jan. 18, 2000

(51) Int. Cl.$^7$ .......................... H01L 23/58; H01L 23/48
(52) U.S. Cl. .................. 257/643; 257/736; 257/642
(58) Field of Search ................... 257/736, 759, 257/760, 635, 637, 642, 643; 438/82, 725, 780, 597

(56) References Cited

U.S. PATENT DOCUMENTS 4,723,197 A * 2/1988 Takiar .................. 361/407
5,719,448 A * 2/1998 Ichikawa ................ 257/781
6,236,061 B1 * 5/2001 Walpita ................ 257/40

FOREIGN PATENT DOCUMENTS

JP          1-241832      * 9/1989

* cited by examiner

Primary Examiner—Steven Loke
Assistant Examiner—Hung Kim Vu
(74) Attorney, Agent, or Firm—Lester H. Birnbaum

(57) ABSTRACT

The invention is a semiconductor device and method of fabricating the device. The device includes a semiconductor substrate with an active region, and a low dielectric constant insulating layer formed over the substrate. An additional insulating layer is formed over the low dielectric constant layer by a low temperature deposition, such as ion beam assistance deposition. A metal layer can then be formed over the additional layer using lift-off techniques. The metal layer can be patterned to form a bond pad which may be displaced from the area over the active region. Wire bonds can be made on the bond pad using ultrasonic energy.

9 Claims, 4 Drawing Sheets

SEMICONDUCTOR DEVICES WHICH UTILIZE LOW K DIELECTRICS

FIELD OF THE INVENTION

This invention relates to semiconductor devices, for example, optical semiconductor devices such as photodetectors.

BACKGROUND OF THE INVENTION

Semiconductor devices, such as photodetectors, often include a wire bond for providing electrical connection to the active regions of the device. Since pressure and ultrasonic energy are applied to effect the bond, the wire bonding process can lead to damage to the device resulting in such undesired characteristics as increased leakage current. In order to avoid this problem, it has been proposed to provide the wire bond pad at some portion away from the active area.

To be effective, such bond sites are desirably formed in a manner which keeps additional capacitance to a minimum. This is of particular significance for high speed devices. It is known that capacitance is a function of the area of the pad, the dielectric constant of the insulating layer over which the pad is formed, and the thickness of the insulating layer. Therefore, one of the design criteria is to use an insulating layer with as low a dielectric constant as possible (known in the art as low k dielectric material) which can be applied with an adequate thickness. Desirably, the dielectric constant is no greater than 3 and the thickness is at least 4 $\mu$m.

Use of low k dielectric materials, however, presents additional problems in the fabrication of the devices. In particular, metals generally adhere poorly to the low k dielectrics and conventional wire bonding techniques utilizing ultrasonic energy leads to low yielding manufacturing processes. Although metal deposition can be effected by sputtering to alleviate the metal adhesion problem, the simple and convenient method of a lift-off process to define metal patterns is not compatible with common sputtering processes. Further, if conventional sputtering is employed to deposit metal, often a conductive interface is produced on the whole surface of the low k dielectric (through a chemical reaction of energetic metal particles) and hence making it virtually impossible to devise a suitable manufacturing process to define a confined metal bond pad.

Furthermore, usually bond pads are thick (2–4 $\mu$m) and hence makes sputtering an unattractive method of manufacturing as compared to conventional electron beam evaporation which is known in the art as having much higher deposition rates.

Unfortunately, if high rate sputtering is employed, substrate temperature may use rise high enough to cause surface degradation of low k dielectrics and eventually lead to potential long term reliability problems.

It is desirable, therefore, to provide a method and optical device utilizing low k dielectric materials.

SUMMARY OF THE INVENTION

The invention in accordance with one aspect is a semiconductor device including a semiconductor substrate, an active region in the substrate, a first low dielectric constant insulating layer formed over at least a portion of the substrate, a second insulating layer formed over at least a portion of the first insulating layer, and a bond pad formed over the second insulating layer and electrically contacting the active region.

The invention in accordance with another aspect is a method of fabricating a semiconductor device including the steps of forming an active region in a semiconductor substrate, forming a first low dielectric constant insulating layer over at least a portion of the substrate, forming a second insulating layer over at least a portion of the first layer by deposition at a temperature no greater then 200° C., and forming a bond pad over the second insulating layer.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

FIGS. 1–7 illustrate the fabrication of a photodetector using principles of the invention. It will be appreciated that the invention is not limited to photodetectors, but can be applied to any semiconductor device where reduced capacitance is desirable.

Figure 1:
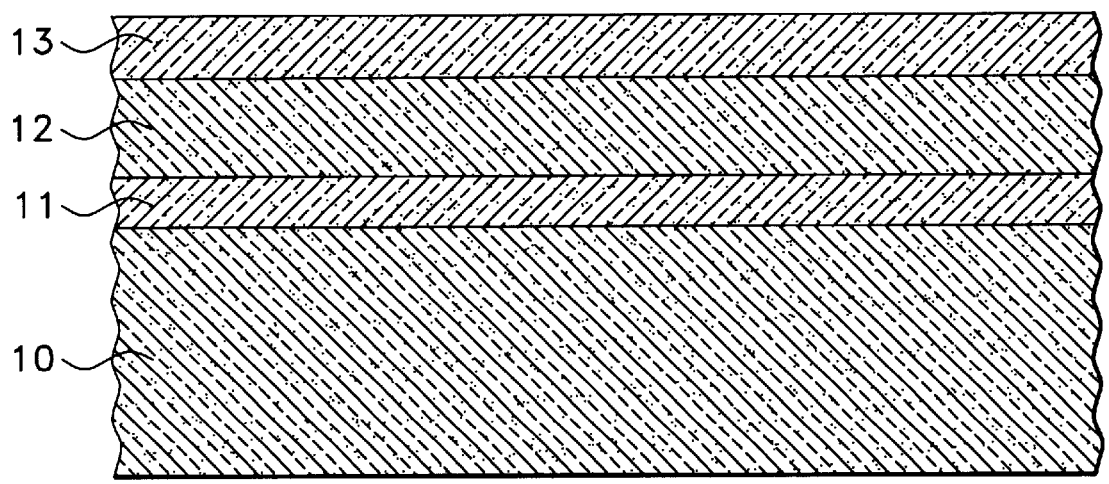
FIGS. 1–7 are cross sectional schematic views of an optical device during various stages of fabrication in accordance with an embodiment of the invention.

FIG. 1 illustrates a typical starting material for the illustrative process. In this example, a semiconductor body, 10, comprising n-type InP is provided, upon which are successively grown epitaxial layers, 11–13. In the context of this application, the body, 10, and the layers, 11–13, are all considered as part of the semiconductor substrate. The layer, 11, was an undoped InP buffer layer with a thickness of approximately 1.5 microns. The layer, 12, was an undoped InGaAs absorber layer with a thickness of 2–5 microns. The layer, 13, was an undoped InP or InGaAsP contact layer with a thickness of approximately 0.5 microns. Such layers are standard for PIN photodiodes.

Figure 2:
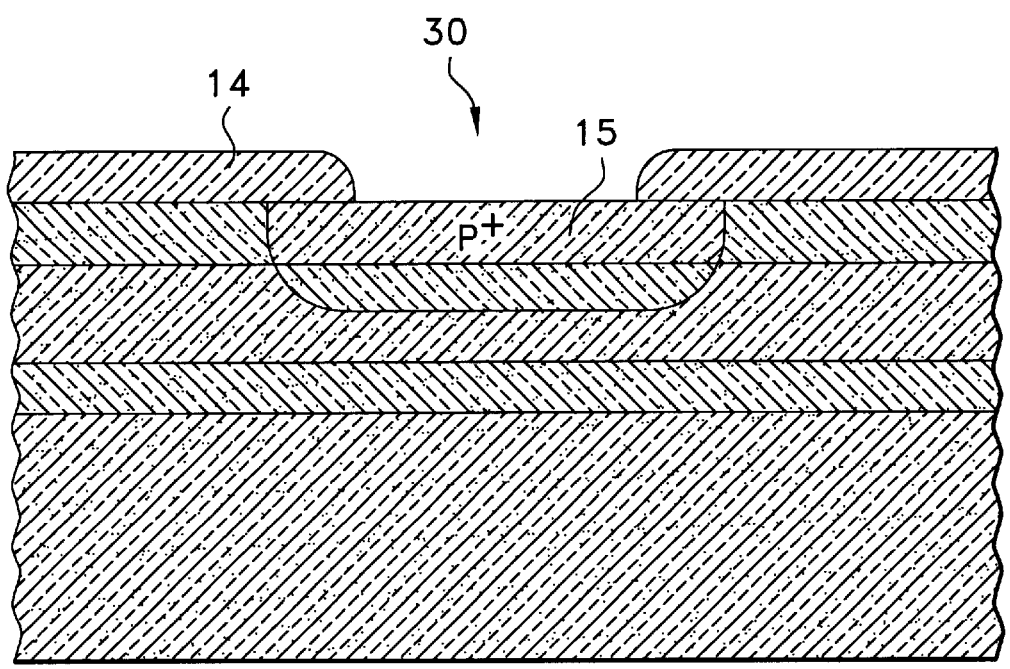

As illustrated in FIG. 2, a dielectric layer, 14, in this example SiN, was deposited over the substrate and patterned by standard photolithographic techniques to form an opening, 30, therein. An active region, 15, was then formed in the substrate by standard diffusion of impurities such as Cd or Zn so that the region, 15, comprised p+ conductivity type extending through the contact layer,13, and part of the absorber layer, 12.

In the context of this application, the "active region" is the region of the semiconductor device which includes a homo or hetero junction of opposite conductivity types. In the case of a photodetector, free carriers are produced in the active region by incident light and provide an electrical read-out. In the case of lasers, free carriers are produced by applying an electrical bias to the device and the carriers recombine to produce light in the active region.

Figure 3:
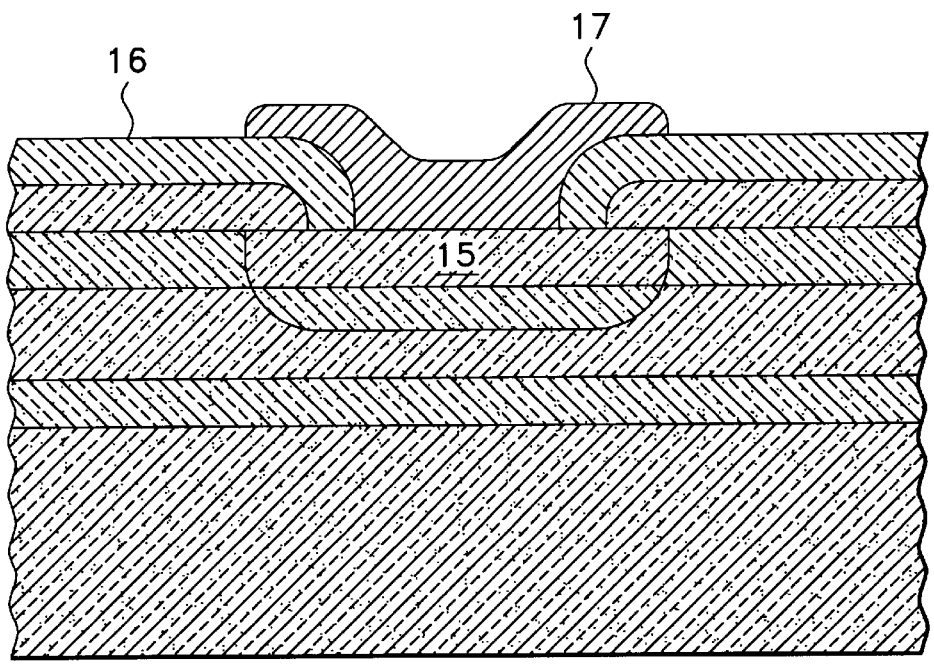

As illustrated in FIG. 3, another dielectric layer, 16, which was also SiN, was deposited over essentially the entire substrate including the dielectric layer, 14, and the exposed portion of the region 15. This layer was also patterned by photolithography to form an opening therein. A metal contact, 17, which was Au—Be/Ti/Pt/Au, was then formed in the opening by standard techniques in order to provide ohmic contact to the active region.

Figure 4:
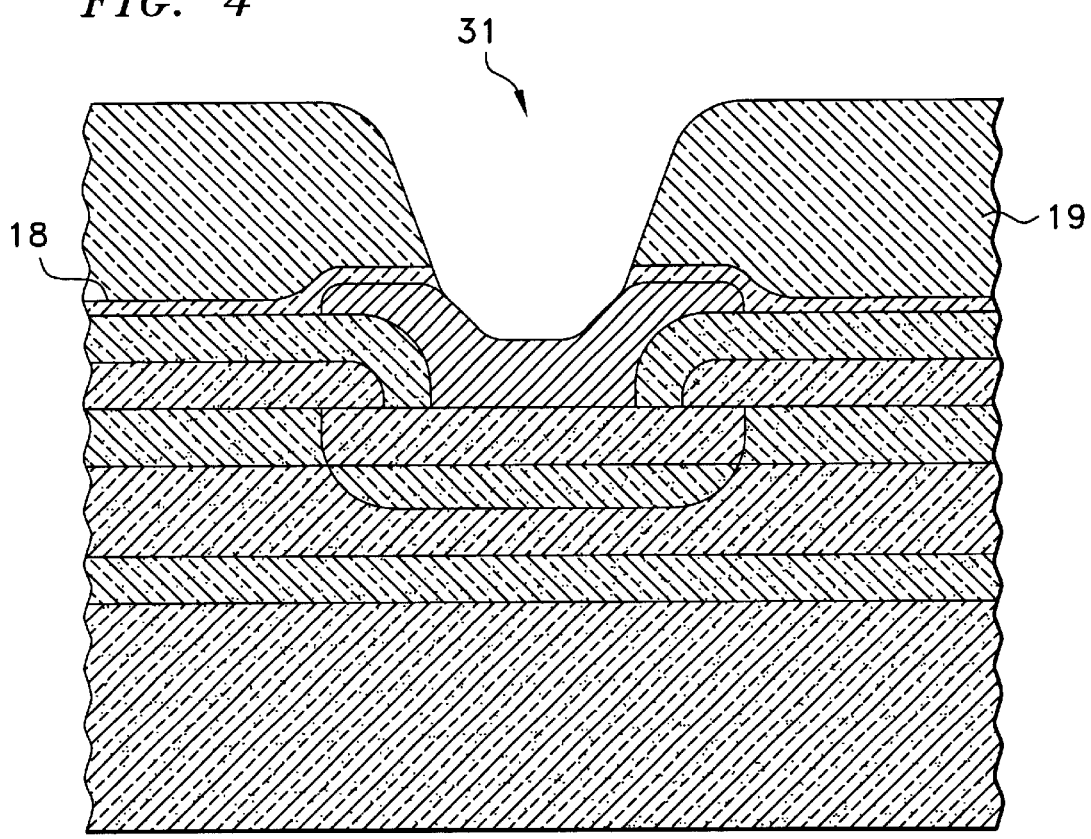

The process continues with the deposition of an adhesion promoter, 18, over the dielectric layer, 16, and contact, 17, as shown in FIG. 4. The adhesion promoter was vinyltriacetoxy silane dissolved in 1-methoxy-2-propanol (sold by Dow Chemical under the designation "AP3000") which was deposited by spinning. A low dielectric constant insulating layer, 19, was then deposited over the structure. In this example, the low k dielectric was B-staged divinyl silane bisbenzocylobutane which is sold by Dow Chemical under the designation Cyclotene™. This material is advantageous since it can be spun-on the structure to a thickness of 5–10 microns. The dielectric constant of the material was approximately 2.56. It should be understood, however, that any organic insulating layer with a dielectric constant less than 3 can be utilized. For example, polyimide or polytetra fluroethylene (Teflon) could be employed. An opening, 31, was formed in the dielectric layer, 19, and adhesion promoter, 18, by exposure of the layer, 19, through a mask (not shown) and then developing with a suitable developer such as dipropylene glycol dimethyl ether to expose the underlying contact, 17. (It will be noted that this particular Cyclotene is a photosensitive material. However, other dielectrics which are not photosensitive can be employed, in which case, a separate patterned photoresist layer could be deposited over the dielectric followed by subtractive etching to define the opening, 31.)

Figure 5:
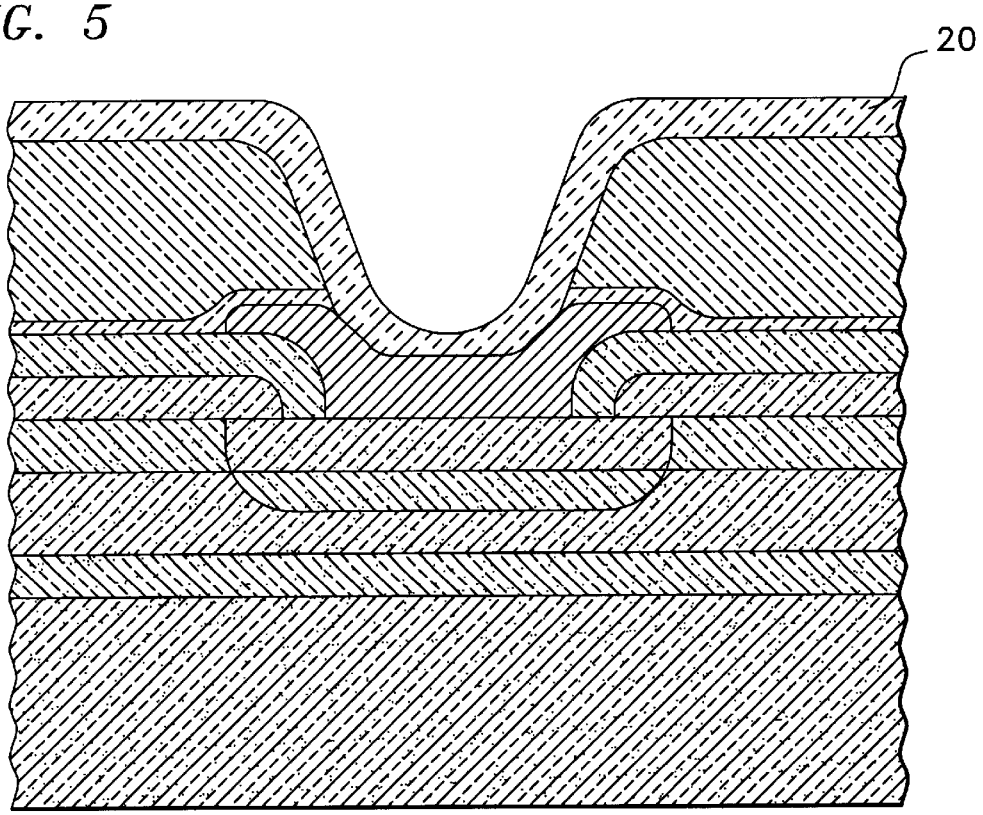

Next, as illustrated in FIG. 5, an additional insulating layer, 20, was deposited over the low k insulating layer, 19, and the exposed portion of the contact, 17. Preferably, the layer is deposited at a temperature of less than 200 deg C. so that the low k dielectric material does not degrade. One preferred method is ion beam assistance deposition, which is described, for example in U.S. Pat. No. 5,802,091 issued to Chakrabarti et al. Briefly, such a deposition involved placing the structure in an evacuated chamber with a crucible containing oxide evaporatant which is impinged with an electron beam. The resulting vapor from the crucible was incident on the surface of the low k dielectric layer, 19, and contact, 17. At the same time, an ion beam comprising energized Ar ions was also incident on the low k dielectric layer and contact. This procedure resulted in a low temperature deposition which was highly uniform. Other techniques which could be employed include sputter deposition and ion beam sputter deposition. In this example, the insulating layer, 20, was a mixture of $Al_2O_3$ and $Ta_2O_5$, but other insulating layers such as $SiO_x(x=114\ 2)$, $TiO_2$, and mixtures thereof may be used. The thickness of the layer, 20, was preferably within the range 1000 to 3000 Å.

Figure 6:
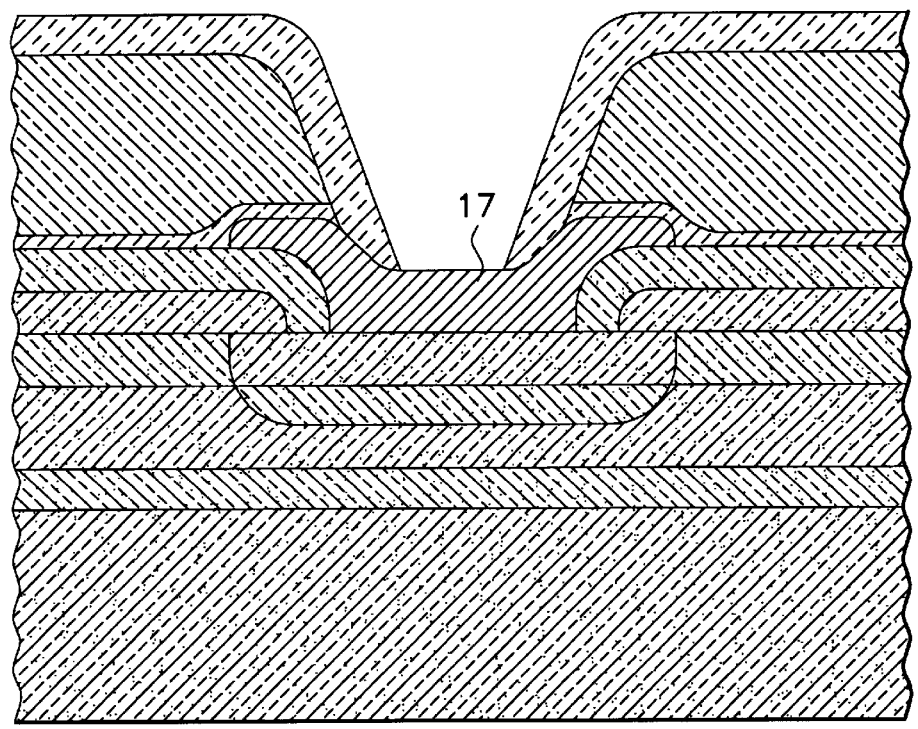

In the next step, illustrated in FIG. 6, the insulating layer, 20, was selectively etched to expose a portion of the underlying contact, 17. Standard photolithography was employed followed by etching. A convenient etchant comprises 1:10 HF and deionized water. It is understood that other methods of etching, e.g., dry etching are also possible.

Figure 7:
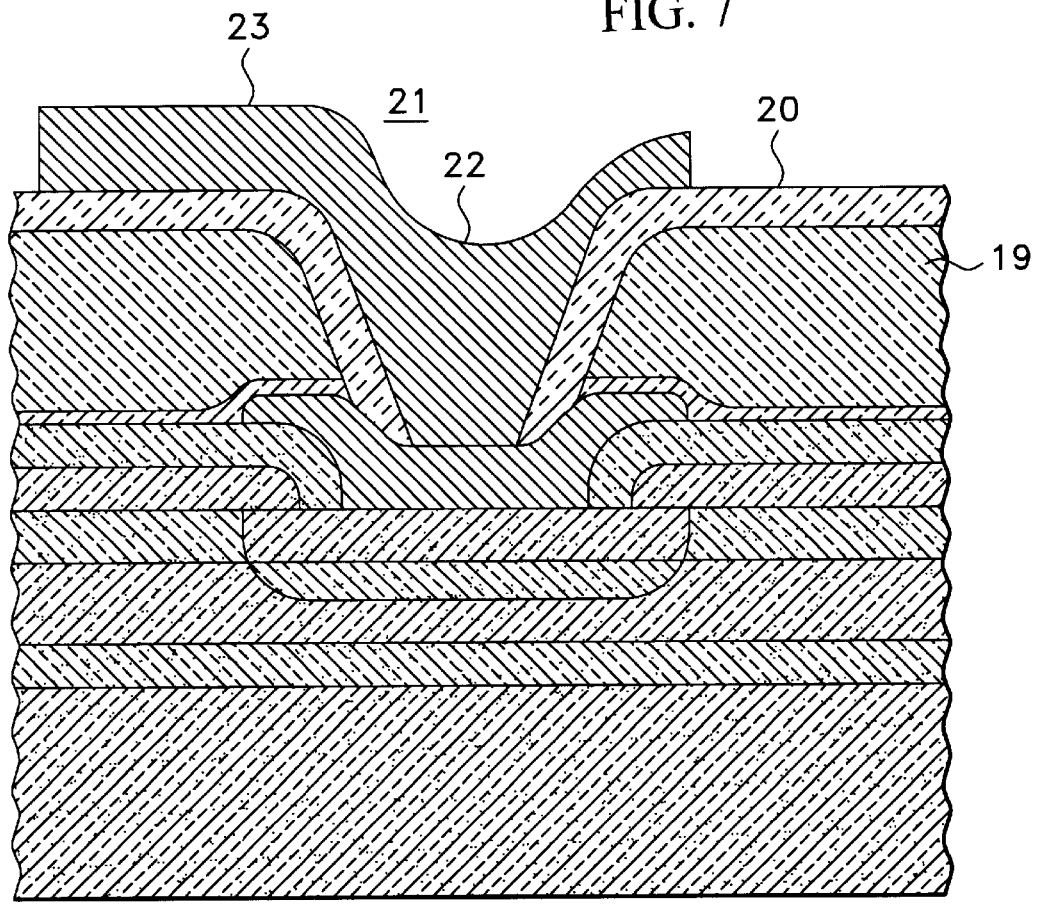
Figure 8:
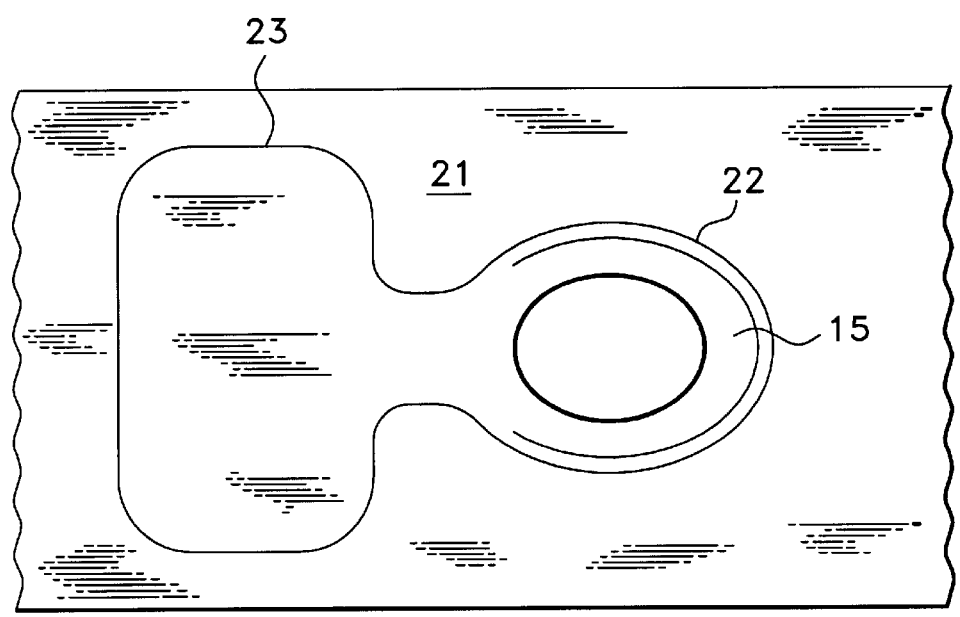
FIG. 8 is a plan view of the device during a stage of fabrication illustrated in FIG. 7.

Subsequently, as illustrated in FIGS. 7 and 8, a metal stack, 21, was deposited over the insulating layer, 20, and the exposed portion of the contact, 17, so as to establish ohmic contact to the active region, 15, of the semiconductor. The metal stack can be, for example, Ti/Pt/Au, Cr/Pt/An, Ni/Pt/Au or Al/Pt/Au. The layer, 21 was deposited by electron beam evaporation to a total thickness within the range 3 μm to 4 μm. The presence of the insulating layer, 20, resulted in excellent adhesion of the metal stack, 21. The metal stack 21 was defined by a lift-off process which would not be used if the metal was deposited by sputtering.

It will also be noted that the metal layer, 21, comprises a contact portion, 22, overlying the active region, 17, and a bond pad portion, 23, which overlies the insulating layers, 19 and 20, and is laterally displaced from the area above the active region. This configuration permits a wire bond (not shown) to be made to the bond pad portion without the risk of damaging the active region.

What is claimed is:

1. A semiconductor device comprising:
   a semiconductor substrate with an active region in the substrate;
   a first low dielectric constant insulating layer formed over at least a portion of the substrate, wherein the first insulating layer comprises a material selected from B-stage Divinyl Silane Bisbenzocylobutane, polyimide, and polytetrafluroethylene;
   a second insulating layer comprising a material selected from $Al_2O_3$, $Ta_2O_5$, $TiO_2$ and mixtures thereof formed over at least a portion of the first insulating layer; and
   a bond pad formed over the second insulating layer and electrically contacting the active region.

2. The device according to claim 1 wherein the bond pad is laterally displaced from an area over the active region.

3. The device according to claim 1 wherein the first insulating layer has a dielectric constant no greater than 3.

4. The device according to claim 1 wherein the second insulating layer is formed by deposition at a temperature of less than 200 deg C.

5. The device according to claim 1 wherein the bond pad comprises a stack of metal selected from Ti/Pt/Au, Cr/Pt/Au, Ni/Pt/Au and Al/Pt/Au.

6. The device according to claim 5 wherein the metal layer is deposited by electron beam evaporation and patterned by a lift-off process.

7. The device according to claim 1 wherein the device is a semiconductor optical device.

8. The device according to claim 7 wherein the device is a photodetector.

9. The device according to claim 1 wherein the second insulating layer comprises a mixture of $Al_2O_3$ and $Ta_2O_5$.

* * * * *